United States Patent
Khvalkovskiy et al.

(10) Patent No.: US 9,087,633 B2
(45) Date of Patent: Jul. 21, 2015

(54) MAGNETIC DEVICE HAVING A MAGNETIC MATERIAL IN A CONTACT STRUCTURE COUPLED TO A MAGNETIC ELEMENT AND METHOD OF MANUFACTURE THEREOF

(75) Inventors: Alexey Vasilyevitch Khvalkovskiy, Milpitas, CA (US); Vladimir Nikitin, Campbell, CA (US); Dmytro Apalkov, San Jose, CA (US); Mohamad Towfik Krounbi, San Jose, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 597 days.

(21) Appl. No.: 13/334,045

(22) Filed: Dec. 21, 2011

(65) Prior Publication Data

US 2013/0161768 A1    Jun. 27, 2013

(51) Int. Cl.
| | | |
|---|---|---|
| H01F 10/32 | (2006.01) | |
| H01L 43/10 | (2006.01) | |
| H01L 43/08 | (2006.01) | |
| G11C 11/16 | (2006.01) | |

(52) U.S. Cl.
CPC ........ *H01F 10/3263* (2013.01); *H01F 10/3286* (2013.01); *H01L 43/08* (2013.01); *H01L 43/10* (2013.01); *G11C 11/161* (2013.01); *H01F 10/3236* (2013.01); *H01F 10/3272* (2013.01)

(58) Field of Classification Search
CPC . H01F 10/32; H01F 10/3263; H01F 10/3286; H01L 29/82; H01L 43/08; H01L 43/10
USPC .................. 257/295, 421, E29.179, E29.167; 365/171, 173
See application file for complete search history.

(56) References Cited

U.S. PATENT DOCUMENTS

| | | | |
|---|---|---|---|
| 7,948,044 B2 | 5/2011 | Horng et al. | |
| 2007/0187785 A1 | 8/2007 | Hung et al. | |
| 2008/0121945 A1* | 5/2008 | Saito | 257/252 |
| 2008/0197433 A1* | 8/2008 | Higo et al. | 257/421 |
| 2010/0230769 A1* | 9/2010 | Ozaki et al. | 257/421 |

FOREIGN PATENT DOCUMENTS

JP  2011-100790  5/2011

OTHER PUBLICATIONS

Tudosa et al., "Perpendicular spin-torque switching with a synthetic antiferromagnetic reference layer", Applied Physics Letters 96, 212504 (2010).

* cited by examiner

*Primary Examiner* — Jose R Diaz
(74) *Attorney, Agent, or Firm* — Renaissance IP Law Group LLP

(57) ABSTRACT

A magnetic device has a contact structure including a magnetic material therein. The contact structure is magnetostatically and/or electrically coupled to a magnetic element such as one having a magnetic tunneling junction (MTJ) multilayer structure. The magnetic material included in the contact structure is configured to compensate for an offset field acting on the free layer of the magnetic element by reference layers of the magnetic element.

26 Claims, 13 Drawing Sheets

3D view, offset at half-pitch (10nm)

1000

MAGNETIC DEVICE HAVING A MAGNETIC MATERIAL IN A CONTACT STRUCTURE COUPLED TO A MAGNETIC ELEMENT AND METHOD OF MANUFACTURE THEREOF

BACKGROUND

The present disclosure relates to magnetic devices such as a magnetic memory device or a spin logic device. More particularly, the principles of the present disclosure relate primarily to a contact structure that is coupled to a magnetic element such as a magnetic tunneling junction (MTJ) structure and is capable of compensating for an offset field, and to a method of manufacturing the same.

Successful application of spin-transfer torque in magnetic devices, including spin transfer torque random access memory (STT-RAM) devices, requires overcoming a number of challenges. For example, an undesirable offset field on a free layer in a MTJ structure may need to be minimized for more stable operation of magnetic devices.

In particular, in a magnetic device, dipolar coupling or dipolar interaction can occur between a reference layer and the free layer due to the dipolar or stray fields exerted therefrom. If such dipolar interaction is significant, an undesirable offset field can be felt at the free layer. In that case, a hysteresis loop of the free layer becomes offset from a zero magnetic field, making operation of the magnetic device more difficult and significantly increasing power consumption. Furthermore, these dipolar or stray fields from the reference layer(s) can interact with adjacent free layers of adjacent magnetic elements or magnetic memory cells, which may further disrupt the operation of the magnetic device. Reducing the offset field can be an issue for any magnetic device. However, the problem of minimizing the offset field becomes increasingly difficult with the scaling down of the magnetic devices.

For these reasons, without reducing the offset field to an acceptable level, the magnetic devices may not provide a viable option for the electronic industry, and may not provide a suitable replacement for conventional semiconductor devices such as dynamic random access memory (DRAM), flash memories, and static random access memories (SRAMs) as hoped.

SUMMARY

In order to provide these and further additional benefits, one embodiment incorporating the present inventive concepts may include a magnetic device comprising a contact structure that includes a magnetic material therein. The contact structure can be magnetostatically and/or electrically coupled to a magnetic element such as one having a magnetic tunneling junction (MTJ) multilayer structure. The magnetic material included in the contact structure can be configured to compensate for an offset field acting on one or more free layers of the magnetic element from one or more reference layers of the magnetic element.

One example of such contact structure may include a magnetic material arranged in a contact hole formed in an interlevel dielectric layer and arranged adjacent (e.g., below or above) the magnetic multilayer structure of the magnetic element.

In one embodiment, the magnetic material may include a ferromagnetic material such as a perpendicular magnetic anisotropy (PMA) material (also called perpendicular magnetic material) including, but not limited to, (1) rare-earth transition metal (RE-TM) alloys such as TbFeCo and GdFeCo; (2) multi-layers such as Co/Pd, Co/Pt, Fe/Pd, Fe/Pt, or Co/Ru; (3) alloys such as CoFeB, CoPd, CoPt, FePt, or FePd; and (4) combinations thereof. The magnetic material may also include a partial perpendicular magnetic anisotropy (PPMA) material, which is a material in which the perpendicular anisotropy energy does not exceed an out-of-plane demagnetization energy. For example, the PPMA layer may include one or more of Co, Fe, Ni and their alloy with other nonmagnetic element, e.g., CoFeB, FeB, CoFeHf, CoFeGe, or CoFeZr. In addition, the PPMA layer may include a multilayer. For example, the PPMA layer may include or consist of Co/Pd, Co/Pt, Fe/Pd, Fe/Pt, Co/Ru, or combinations thereof. Also, the magnetic material may include a combination of PPMA and PMA materials. Alternatively, other non-ferromagnetic magnetic materials may be used for the magnetic material arranged in the contact hole within the spirit and scope of the present inventive concept.

In some embodiments, the magnetic material can be represented, for instance, by the formula XY, where X may be at least one of Ni, Co, or Fe; and where Y can be either Pt or Pd, or a combination thereof. Alternatively, the magnetic material can be represented by the formula XYZ, where X and Y are as described above and where Z includes one or more of Ti, Zr, Hf, V, Nb, Ta, Cr, Mo, W, Ir, Rh, Ru, Os, Re, Au, Ag, Cu, B, C, N, O, Al, Si, P, S, Ga, Ge, In, Sn, Gd, Tb, Dy, Ho, Nd, or a transition metal silicide. Other magnetic materials are also within the contemplation of this invention and can be used to provide the magnetic material. The magnetic material may be arranged in the contact hole in the form of a magnetic layer. However, the magnetic material may be arranged in other forms such as separated portions of the magnetic material dispersed within a contact material or selectively or randomly dispersed dots, blocks or other shapes of magnetic material.

The magnetic layer or magnetic material may be designed and set such that its dipolar magnetic field (i.e., the offset field or stray field) counteracts the total offset or bias field created by the one or more reference layers in the magnetic multilayer structure and acting on the free layer. The magnetic layer or material can be formed, for instance, as an insertion at any level within a contact material arranged in the contact hole, or as a layer on top of or below the contact material. The magnetic layer or material will, however, exert a stronger stray field on the free layer the closer it is arranged to the magnetic multilayer structure.

By providing a magnetic layer or magnetic material within the contact hole to counteract the offset or bias field created by the reference layer(s) of the magnetic multilayer structure, the tolerances for the reference layer(s) can be significantly relaxed, allowing for much greater flexibility in the design of the magnetic element. Using principles of the present disclosure, therefore, the magnetic multilayer structure can be designed to optimize the desired properties of the magnetic element, for instance, without regard to the offset or bias field. A magnetic layer or magnetic material can then be designed and implemented in the contact hole to compensate for any $H_{offset}$ or bias field of the magnetic multilayer structure.

In an alternative embodiment, a magnetic layer or magnetic material arranged in the contact hole can act as a reference layer for a MTJ structure such as a dual magnetic tunneling junction (DMTJ) structure, for instance. In this embodiment, the magnetic layer or material can be arranged fully or only partially within the contact hole (i.e., completely or partially below the upper surface of an interlevel dielectric layer), and can function as one of the reference layers for the magnetic element. Also, a magnetic layer or a magnetic material arranged in the contact hole can act as a reference layer for a single MTJ (single tunneling barrier formed of a material such as magnesium oxide or aluminum oxide) structure. Again, in this case, the magnetic layer or material can be arranged completely or only partially within the contact hole (i.e., completely or partially below the upper surface of the interlevel dielectric layer).

In still another embodiment, a magnetic material or magnetic layer arranged in the contact hole can be a part of a synthetic anti-ferromagnetic (SAF) structure. The SAF structure can be implemented, for instance, in either an MTJ or DMTJ structure.

An additional embodiment illustrating the inventive concepts may provide additional margin for the offset field. For instance, an embodiment may utilize a high-$M_s$ PMA material to provide additional margin for the offset field. Additionally, or alternatively, the diameter of the magnetic layer in the contact hole can be increased to increase the manufacturing process margin.

In a further embodiment, all or substantially the entire contact hole can be filled with a soft magnetic material (e.g., iron (Fe) and the like) or a PPMA material to form a contact structure such as a bottom electrode contact or a bottom contact. In this embodiment, the thickness (or depth) of the soft magnetic material in the contact structure may be substantially equal to or larger than the diameter of the contact structure, such that the shape anisotropy of the insertion can enhance its magnetic stability.

Various methods of manufacture are also contemplated for providing the inventive concepts. According to one embodiment, a contact hole such as a bottom electrode contact hole can be formed in an interlevel dielectric layer over a semiconductor substrate. The contact hole can then be partially filled with, for example, a contact material (e.g., tungsten (W)) to form a contact structure such as a bottom electrode contact (BEC) or bottom contact (BC), with a transistor or other device or connector arranged between the BEC or BC and the semiconductor substrate. A magnetic material such as a ferromagnetic material can then be deposited to form a magnetic layer over the partially filled conductive material up to a desired level within the contact hole. The remainder of the contact hole, if any, can then be filled with W or other appropriate contact material up to the upper surface level of the interlevel dielectric layer. Any excess magnetic material can be removed through a chemical mechanical planarization (CMP), or other similar process. A magnetic multilayer structure such as a MTJ structure can then be formed over the filled contact hole.

In an alternative embodiment, the contact hole can be filled up to the level of the upper surface of the interlevel dielectric layer with a contact material (e.g., W or other conventional material). A divot can then be formed in the filled contact material, such as through RIE etching or other etching process. A magnetic material can then be deposited in the divot formed in the contact material to fill the divot. Any excess magnetic material can be removed through CMP or other similar process. A magnetic multilayer structure can then be formed above the filled contact hole.

It should be noted that the inventive concepts are not limited by any of the specific embodiments described in the foregoing summary, and that numerous other aspects and embodiments utilizing the present inventive concepts will be readily understood by those of ordinary skill in the art from the disclosures provided herein. Details of these and other embodiments are included in the detailed description and the accompanying drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to like elements throughout the different views. The drawings are not necessarily to scale, emphasis instead being placed upon illustrating the various principles of the inventive concepts. In the drawings.

DETAILED DESCRIPTION

Figure 1A:
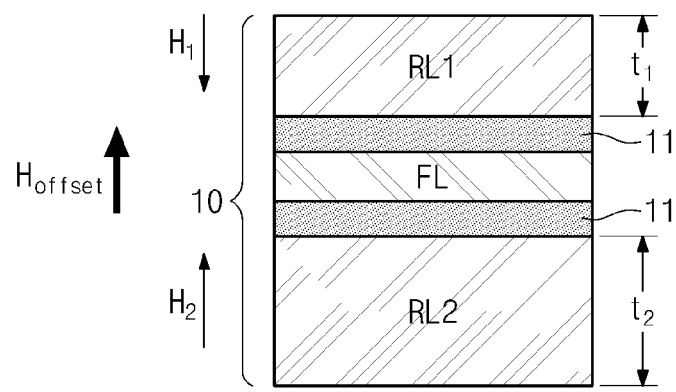
FIGS. 1a through 1c are schematic diagrams illustrating magnetic multilayer structures of magnetic elements.

Various embodiments illustrating the present inventive concepts will now be described more specifically with reference to the accompanying drawings. The inventive concepts may, however, be embodied in different forms and should not be construed as limited to the specific embodiments set forth herein. Rather, these embodiments are provided to ensure that this disclosure is thorough and complete and fully conveys the scope of the inventive concept to those skilled in the art. In the drawings, the sizes and relative sizes of layers and regions may be exaggerated for clarity. Like numbers refer to like elements throughout.

Embodiments incorporating principles of the inventive concepts may be described herein with reference to cross-sectional illustrations that are schematic illustrations of idealized embodiments. As such, variations from the idealized shapes of the illustrative embodiments as a result of manufacturing techniques and/or tolerances, for instance, are to be expected. The embodiments disclosed herein should therefore not be construed as limited to the particular shapes of regions illustrated, but are to be construed to include deviations in shapes that result, for example, from manufacturing or other design considerations. The regions illustrated in the figures are schematic in nature and their shapes are not intended to illustrate the precise shape of a region of a device and, unless expressly stated otherwise, are not intended to limit the scope of the invention.

In the present specification, the same reference numerals may refer to components having the same features and/or function but not necessarily the same structural characteristics. Components denoted by the same reference numerals may therefore assume different shapes, sizes, or other characteristics. Also, in the present specification, the term "adjacent" may be interpreted as "relatively close to." For example, being adjacent to a first layer may be interpreted as being closer to a first layer than to a second layer.

Figure 1B:
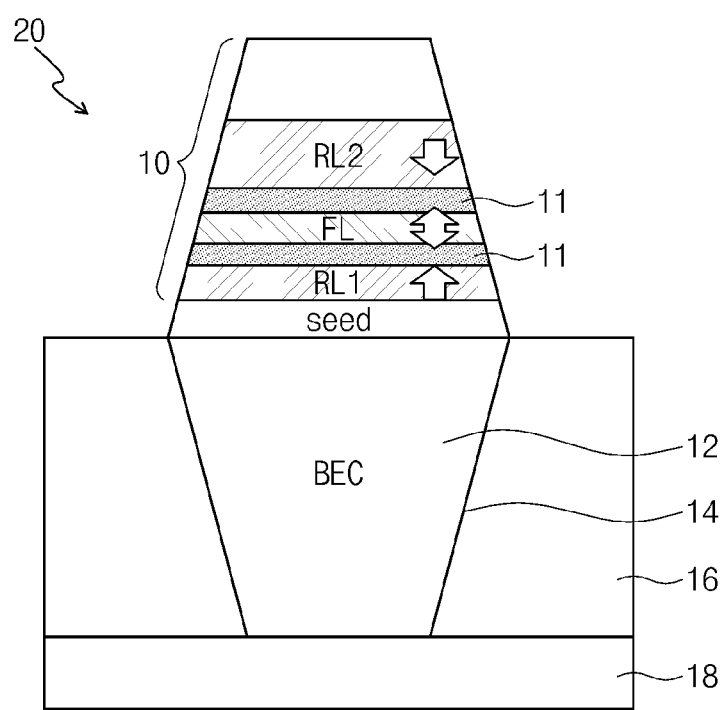
Figure 1C:
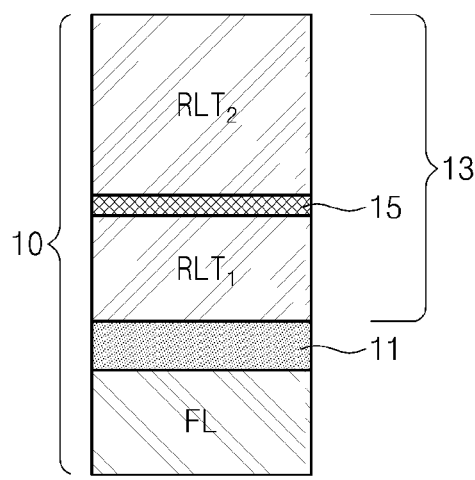

FIGS. 1a through 1c are schematic cross-sectional illustrations of magnetic elements as may be used in magnetic devices such as a magnetic memory. Referring to FIGS. 1a through 1c, a portion of a magnetic device (not fully shown) may have a magnetic element comprised of a magnetic multilayer structure 10 arranged above and electrically coupled to a contact structure 12. The contact structure 12 may be, for instance, a bottom electrode contact (BEC) or bottom contact (BC) formed within a contact hole 14 in an interlevel dielectric layer 16 (see, e.g., FIG. 1b) overlying a semiconductor substrate 18. An access transistor, connector, or other device (not shown) may be arranged between the BEC or BC and the semiconductor substrate 18. The magnetic multilayer structure 10 can be electrically coupled to the access transistor, connector, or other device through the contact structure 12 for a read/write operation, for example. The magnetic multilayer structure 10 may, for instance, include single or dual reference layers RL1, RL2 arranged proximal to one or more free layers (FL). In some embodiments, there may be more than two reference layers included in the magnetic multilayer structure 10.

The magnetic multilayer structure 10 may be a magnetic tunneling junction (MTJ) structure, which typically may include one or more pinned layers (i.e., reference layers), and a free layer separated from the reference layer(s) by a tunneling barrier layer formed of an insulating material such as magnesium oxide (MgO) or aluminum oxide. The free layer may be formed using a low $M_s$ ferromagnetic material or a ferromagnetic material doped with non-magnetic materials. According to some embodiments, the tunneling barrier layer may have a granular layer including conductive channels in an insulating mix. The pinned layer has magnetization of the reference layer fixed (pinned) in a particular direction while the magnetization direction of the free layer is free to rotate.

As a result, a spin-polarized current can switch the magnetization direction of the free layer if the current density is sufficiently high. In other words, the magnetic element is configured to allow the magnetization of the free layer to be switched due to spin transfer when a write current is passed through the magnetic element. It should also be noted that the pinning layer(s) may be optionally included in various in-plane and perpendicular magnetic structures according to some embodiments of the present disclosure. The access transistor discussed above may also include a MTJ structure.

Specifically, the magnetic multilayer structure 10 can include, for instance, a Single Magnetic Tunneling Junction (MTJ) structure having a single tunneling barrier layer 11 and a free layer FL (see, e.g., FIG. 1c) or Dual Magnetic Tunneling Junction (DMTJ) structures having two tunneling barrier layers 11 formed of a nonmagnetic material such as MgO with a free layer arranged therebetween (see, e.g., FIGS. 1a-1b).

A synthetic anti-ferromagnetic (SAF) structure may be used for the reference layers (pinned layers) RL1, RL2 or for the free layer FL in either of these magnetic multilayer structures 10 or other magnetic multilayer structures within the spirit and scope of the present disclosure. FIG. 1c, for instance, illustrates a MTJ magnetic multilayer structure 10 having a SAF structure 13 with multilayers $RlT_1$, $RlT_2$ anti-ferromagnetically or ferromagnetically coupled through thin layers 15, such as a Ru layer. In addition, the free layer structure FL may utilize ferromagnetically or anti-ferromagnetically coupled multilayers through thin conductive layers such as a Ru layer.

Figure 2A:
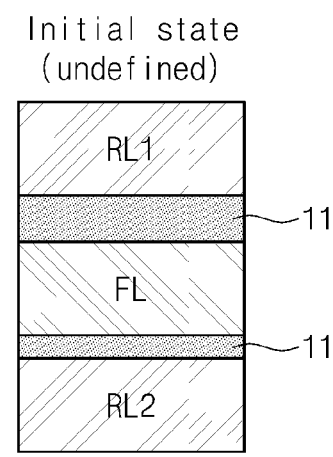
FIGS. 2a through 2c are schematic diagrams illustrating a method of setting the reference layers in a DMTJ magnetic multilayer structure.
Figure 2B:
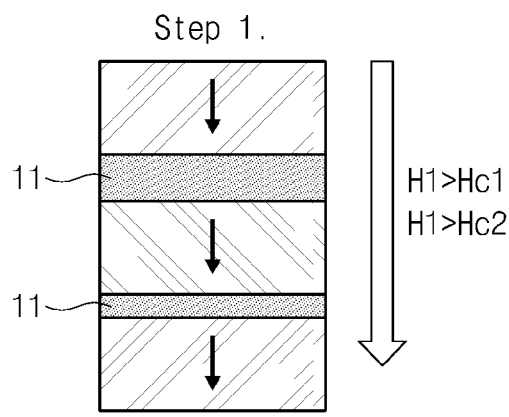
Figure 2C:
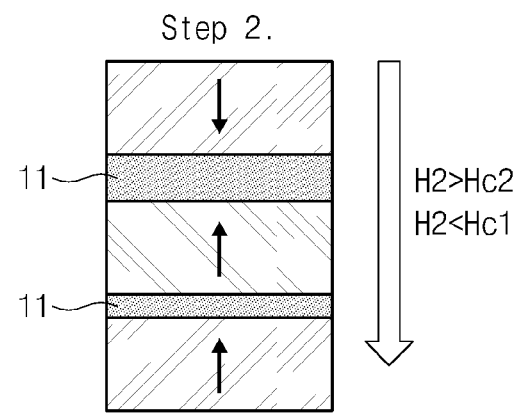

In the magnetic multilayer structures 10, two reference layers RL1, RL2 may be utilized having sufficiently different saturation magnetization ($M_s$) values so that the direction of magnetization of the reference layers RL1, RL2 can be set during a set procedure. $M_s$ values of between 500 to 1500 emu/cc may be particularly well-suited for accomplishing the principles described herein. An example of one commonly used set procedure will now be described with reference to FIGS. 2a through 2c. The reference layer materials can be selected such that the coercive field or switching field $H_{c1}$ (i.e., the magnetic field strength required to switch the orientation of the magnetic field from one direction to the opposite direction) of the first reference layer RL1 is greater than the coercive field or switching field $H_{c2}$ of the second reference layer RL2. The magnetic states of the two reference layers RL1 and RL2 and free layer FL can be initially undefined (see FIG. 2a).

A first magnetic field H1 is then applied to the DMTJ structure to bias the first reference layer RL1 in a desired magnetization direction. Because this first magnetic field H1 is stronger than the switching fields $H_{c1}$ and $H_{c2}$ of reference layers RL1 and RL2, respectively, as well as that of the free layer FL, all three layers are initially biased in a single magnetization direction (see FIG. 2b). A second magnetic field H2 is then applied in a direction opposite the first magnetic field H1 (see FIG. 2c). This second field H2 has a magnitude less than the switching field $H_{c1}$ of the first reference layer RL1, but greater than the switching field $H_{c2}$ of the second reference layer RL2, as well as that of the free layer FL. Accordingly, the direction of magnetization of the second reference layer RL2 and the free layer RL are switched, and, because the direction of magnetization of the first reference layer RL1 is unchanged by the switching field $H_{c2}$, they are therefore set opposite that of the first reference layer RL1.

The magnetic properties and thicknesses of the two reference layers RL1, RL2 are typically selected to minimize the amount of an offset field ($H_{offset}$) or bias field between the reference layers RL1, RL2 and the free layer FL. The H value, or magnetic field, created by a reference layer is approximately equal to its saturation magnetization (Ms) times its thickness (t) times a factor C, which typically depends on the geometry of the memory cell. Accordingly, when two reference layers are used, the $M_s$ values, C factors, and thicknesses can be selected so as to minimize an offset field ($H_{offset}$). Referring back to FIG. 1a, a magnetic field $H_1$ asserted by the first reference layer RL1 can be expressed as the saturation magnetization $M_{s1}$ of the first reference layer RL1 times the thickness $t_1$ of the first reference layer RL1 times a factor C1, according to the formula:

$$H_1 = M_{s1} * t_1 * C_1$$

Likewise, the magnetic field $H_2$ imposed by the second reference layer RL2 can be expressed as the saturation magnetization $M_{s2}$ of the second reference layer RL2 times the thickness $t_2$ of the second reference layer RL2 times a factor C2 for the second RL2, according to the formula:

$$H_2 = M_{s2} * t_2 * C_2$$

Ideally, the selection of the saturation magnetization, values of the parameters C and thicknesses of the two reference layers RL1, RL2 should be such that the overall offset field $H_{offset}$ imposed by the two reference layers $RL_1$ and $RL_2$ on the free layer FL should be as close to zero as possible, according to the formula.

$$H_1 H_2 = H_{offset} \text{(where } H_{offset} \text{ is preferably around 0).}$$

Unfortunately, however, there are practical limits on the thicknesses of the reference layers (e.g., RL1, RL2), and it is difficult to manufacture the magnetic multilayer structures in a way that sufficiently reduces or eliminates the offset field. In other words, with current magnetic multilayer structures, the offset field $H_{offset}$ can be large since it is difficult to design and manufacture a magnetic multilayer structure in which the first and second reference layers RL1, RL2 completely compensate for each other's stray field. This is also true for magnetic multilayer structures having one or more than two reference layers.

For instance, although reducing a thickness of the high $M_s$ layer can reduce the offset field ($H_{offset}$), it can still be difficult to completely eliminate the stray fields acting on the free layer from the references layers (i.e., to reduce the offset field to zero).

What is needed, therefore, is a structure that compensates for the offset field acting on the free layer while avoiding stringent tolerance limitations. A method of manufacturing the improved structure would also be desirable.

The below example embodiments discuss novel ways to compensate for an offset field acting on a free layer such that further scaling down of STT-RAM or other magnetic devices can be possible.

One embodiment incorporating the present inventive concepts may include a magnetic device comprising a contact structure that includes a magnetic material therein. The contact structure can be magnetostatically and/or electrically coupled to a magnetic element such as one having a magnetic tunneling junction (MTJ) multilayer structure. The magnetic material included in the contact structure can be configured to compensate for an offset field acting on one or more free layers of the magnetic element by one or more reference layers of the magnetic element. One example of such contact structures may include a magnetic material arranged in a contact hole formed in an interlevel dielectric layer and arranged adjacent (e.g., below or above) the magnetic multilayer structure of the magnetic element. Such aspects of the present disclosure will be described in further detail below.

Figure 3:
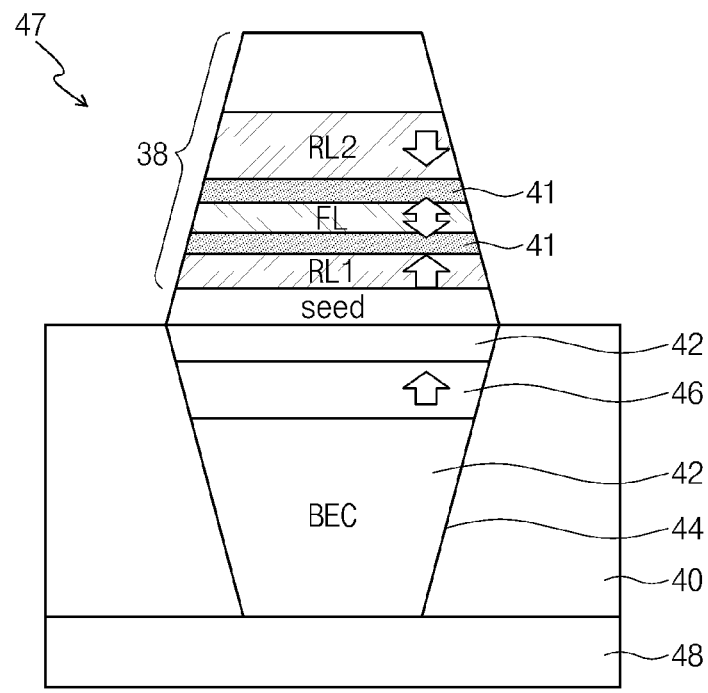
FIG. 3 is a schematic cross-sectional view of a magnetic element having a magnetic multilayer structure arranged over a contact hole configured according to various principles of the present inventive concepts.

FIG. 3 is a schematic cross-sectional diagram of a portion 47 of a magnetic device (not shown) constructed according to some embodiments of the present disclosure. Referring to FIG. 3, a portion of the magnetic device 47 can include a magnetic element comprised of a magnetic multilayer structure 38 arranged above a contact structure 42 such as a bottom electrode contact (BEC) or bottom contact (BC). The contact structure 42 may be disposed in a contact hole 44 formed in an interlevel dielectric layer 40 over a semiconductor substrate 48. The contact structure 42 may be electrically coupled to a drain of an access transistor, a connector, or a diode or other device (not shown) formed on the semiconductor substrate 48 for performing the read/write operations, for example. The contact structure 42 may be indirectly coupled to the drain of the access transistor, a connector, or a diode or other device via a landing contact. The magnetic multilayer structure 38 can be a DMTJ structure, for instance, having a first reference layer RL1 and a second reference layer RL2 arranged on opposite sides of a free layer FL with a tunneling barrier layer 41 formed on either side of the free layer FL of a dielectric material such as magnesium oxide or aluminum oxide. The $M_s$ values of the reference layers RL1 and RL2 may be selected to permit their directions of magnetization to be set opposite each other during a set procedure (such as that described previously with respect to FIGS. 2a-2c).

According to some embodiments, the side profile of the magnetic multilayer structure 38 may be sloped or tapered. In another embodiment, the side profile of the magnetic multilayer structure 38 may be substantially vertical. Although not illustrated, a top contact structure may be formed over the magnetic multilayer structure 38 to be electrically and/or magnetostatically coupled to the free layer such that current can be driven through the memory or logic element of the magnetic device.

The contact hole 44 may be formed in the interlevel dielectric layer 40 and arranged below the magnetic multilayer structure 38.

In some embodiments, the contact structure 42 may include a non-magnetic contact material (such as Tungsten (W)) filling a majority of the contact hole 44. A magnetic material or a magnetic layer 46 may be arranged between layers of the contact material deposited within the contact hole 44 (i.e., as an insertion within the contact material 42). The magnetic material or magnetic layer 46 in the contact hole 44 may be designed having a saturation magnetization ($M_s$), magnetic anisotropy constant $K_u$, and thickness (t) such that its magnetic field can be set during a set procedure for the magnetic element, and further such that, while in operation, its magnetic field compensates for the stray fields exerted by the reference layers RL1, RL2. In other words, the magnetic layer or material 46 can exert a stray field on the one or more free layers FL, thereby reducing an offset field experienced by the free layer(s) due to the dipolar field from the one or more reference layers in the magnetic multilayer structure 38. The stray field exerted from the magnetic layer 46 is directed opposite to the direction of the total offset field exerted by the reference layers RL1, RL2, thereby compensating for the offset field acting on the free layer(s) FL.

In one embodiment, the magnetic material may include a ferromagnetic material such as a perpendicular magnetic anisotropy (PMA) material (also called perpendicular magnetic material) including, but not limited to, (1) rare-earth transition metal (RE-TM) alloys such as TbFeCo and GdFeCo; (2) multi-layers such as Co/Pd, Co/Pt, Fe/Pd, Fe/Pt, or Co/Ru; (3) alloys such as CoFeB, CoPd, CoPt, FePt, or FePd; and (4) combinations thereof. The magnetic material may also include a partial perpendicular magnetic anisotropy (PPMA) material, which is a material in which the perpendicular anisotropy energy does not exceed an out-of-plane demagnetization energy. For example, the PPMA layer may include one or more of Co, Fe, Ni and their alloy with other nonmagnetic element, e.g., CoFeB, FeB, CoFeHf, CoFeGe, or CoFeZr. In addition, the PPMA layer may include a multilayer. For example, the PPMA layer may include or consist of Co/Pd, Co/Pt, Fe/Pd, Fe/Pt, Co/Ru, or combinations thereof. Also, the magnetic material may include a combination of PPMA and PMA materials. Alternatively, other non-ferromagnetic magnetic materials may be used for the magnetic material arranged in the contact hole within the spirit and scope of the present inventive concept.

In some embodiments, the magnetic material can be represented, for instance, by the formula XY, where X may be at least one of Ni, Co, or Fe; and where Y can be either Pt or Pd, or a combination thereof. Alternatively, the magnetic material can be represented by the formula XYZ, where X and Y are as described above and where Z includes one or more of Ti, Zr, Hf, V, Nb, Ta, Cr, Mo, W, Ir, Rh, Ru, Os, Re, Au, Ag, Cu, B, C, N, O, Al, Si, P, S, Ga, Ge, In, Sn, Gd, Tb, Dy, Ho, Nd, or a transition metal silicide. In addition, the magnetic material may be materials with interfacial anisotropy, e.g. materials having $Co_xFe_{1-x}B_y$ as one of their components, where x and y can be between 0 to 1 (including 0 and 1), and other components being e.g. MgO or Ta. Other magnetic materials are also within the contemplation of this invention and can be used to provide the magnetic material.

The magnetic material may be arranged in the contact hole 44 in the form of one or more layers. However, the magnetic material may be arranged in other forms. For example, separated portions of the magnetic material, or dots, blocks or other shapes, may be selectively or randomly dispersed within the contact material 42. In some embodiments, the contact material 42 may be doped with a magnetic material to compensate for the offset field of the magnetic multilayer structure 38 within the spirit and scope of the present disclosure.

As discussed above, the magnetic layer 46 may be formed as an insertion within the contact material at any level within the contact hole 44. In other embodiments, however, it may be formed as a layer on top of or below the contact material 42 in the contact hole 44. As a general rule, however, the magnetic layer 46 will exert a stronger effect on the offset field the closer it is arranged to the free layer FL of the magnetic multilayer structure 38.

Various micromagnetic simulations were performed to analyze and predict the effects of the magnetic layer arranged within the BEC structure. These simulation results were relied at some specific parameter values and they are provided by way of example only and, except as may be explicitly recited in the claims, are not intended to limit the scope of the present invention.

Figure 4A:
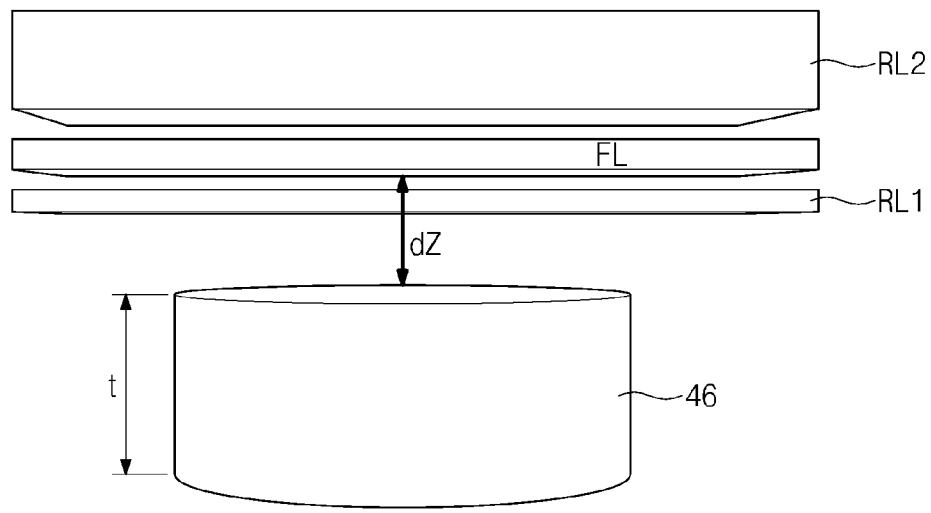
FIG. 4a is a schematic diagram illustrating the distance between a bottom reference layer in the magnetic multilayer structure and the magnetic layer arranged in the contact hole.
Figure 4B:
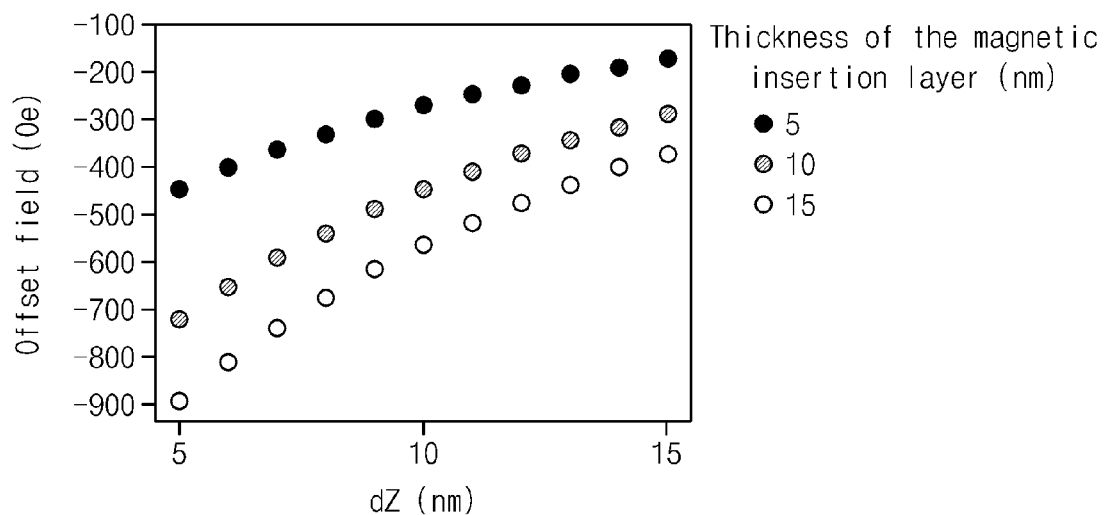
FIG. 4b is a graph illustrating the effects of adjusting the thickness of the magnetic layer in the contact hole, as well as its distance from the reference layers in the magnetic multilayer structure, as determined through micro magnetic simulations based on some specific simulation parameters.

FIG. 4a is a schematic diagram illustrating the relationships between the reference and free layers in the magnetic multilayer structure 38 and the magnetic layer 46 arranged in the contact hole 44. FIG. 4b is a graph illustrating the effect the thickness "t" of the magnetic layer 46, and the distance dZ between the magnetic layer 46 and the free layer FL, has on the offset field exerted by the magnetic layer 46 onto the free layer FL. The graph in FIG. 4b is the result of micro magnetic simulations based on the specific parameters shown, which illustrate various principles that may be applicable to, but not limiting of, the invention. As can be seen from the graph in FIG. 4b, based on these simulation parameters, increasing the thickness of the magnetic layer 46 increased the magnitude of the stray field which can be used to compensate for an offset field felt by the free layer FL. In addition, the closer the magnetic layer 46 to the free layer FL, the greater the influence of its stray field acting on the free layer FL (i.e., a larger stray field acting on the free layer FL).

As discussed above, the stray field from the magnetic layer 46 may have a direction opposite to the direction of the total offset field exerted by the reference layers (e.g., RL1, RL2), thereby compensating for the offset field acting on the free layer FL. For this reason, the larger the stray field exerted by the magnetic layer 46, the greater the $H_{offset}$ margin allowed for the reference layers.

More specifically, with a magnetic layer thickness of 5 nm arranged at a distance of 15 nm from the free layer FL, the strength of the stray field from the magnetic layer 46 in this simulation can be only about −200 Oersted (Oe). However, with a magnetic layer thickness of 15 nm arranged at a distance of 5 nm from the free layer FL, the magnetic stray field can be approximately −900 Oe for these simulation parameters.

As further shown in FIG. 4b, magnetic field strengths between these two extremes can be created by adjusting the thickness of the magnetic layer 46 and its distance from the bottom reference layer RL1. Accordingly, the thickness of the magnetic layer 46 and its distance from the reference layer RL1 can be designed to counteract or balance the offset field or bias field of the magnetic multilayer structure 38.

Figure 5A:
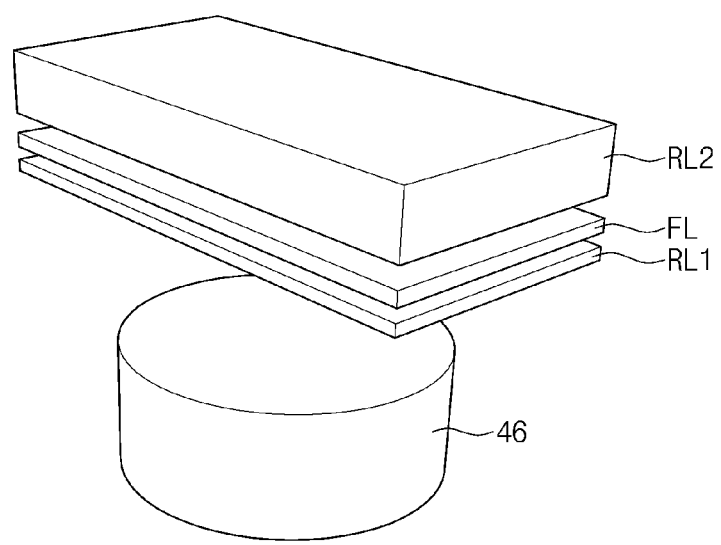
FIG. 5a is a schematic perspective view illustrating a relationship between a magnetic layer in the contact hole and various magnetic layers of the DMTJ structure in a magnetic element constructed according to FIG. 3.
Figure 5B:
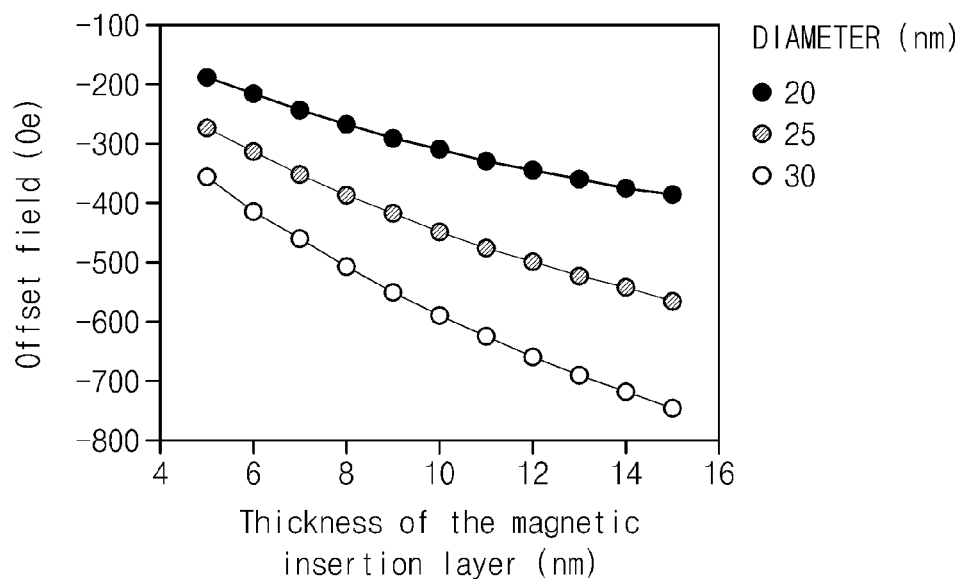
FIG. 5b is a graph illustrating the effects of modifying a thickness and diameter of the magnetic layer in the contact hole as determined through some micro magnetic simulations based on specific simulation parameters.

In addition to these parameters, the diameter of the magnetic layer 46 in the contact hole 44 also affects the strength of its stray field. FIG. 5a is a schematic diagram again illustrating the relationship between reference layers in a magnetic multilayer structure 38 and the magnetic layer 46 arranged in the contact hole 44. FIG. 5b is a graph based on specific micro magnetic simulation parameters illustrating the effect the diameter of the magnetic layer 46 (and the thickness of the magnetic layer 46) has on the stray field strength.

In this embodiment, for instance, the simulation parameters include an $M_s$ of the magnetic layer in the BEC set to 800 emu/cc, a magnetic layer diameter of 25 nm, a magnetic layer thickness of 12 nm, a distance between the magnetic layer 46 and the free layer of 12 nm, and a MTJ cell size of 20 nm×40 nm. The simulation illustrated that these specific parameters may provide an additional margin of approximately 500 Oe or more for the offset field. The simulations also illustrated generally that in embodiments utilizing high-$M_s$ PMA materials (i.e., those having an $M_s$ of 800 emu/cc and higher) as the magnetic layer 46 or magnetic material arranged in the contact hole, reducing the distance between the magnetic layer 46 in the contact hole and the free layer FL may provide additional margin for the offset field. Additionally, or alternatively, the diameter of the magnetic layer 46 in the contact hole can be increased to provide further margin.

More specifically, as shown in FIG. 5b, just as an increase in thickness increases the strength of its stray field, so also the greater the diameter of the magnetic layer 46, the greater the strength of its stray field to compensate for the offset field acting on the free layer FL. For instance, modifying the diameter of the magnetic layer 46 between 20 nm and 30 nm can provide an additional $H_{offset}$ margin of 500 Oe or more for the fabrication of the magnetic device. The margin also increases along with increases in the diameter of the magnetic layer 46. Accordingly, the diameter of the magnetic layer 46 arranged within the contact hole 44 can also be selected so as to appropriately compensate for the offset and/or bias fields of the magnetic multilayer structure.

By providing the magnetic material or the magnetic layer 46 within the contact hole 44 to counteract the total offset field created by the reference layer(s) of the magnetic multilayer structure 38, the tolerances for the reference layer(s) can be significantly relaxed, significantly increasing the $H_{offset}$ margin, and thereby allowing for much greater flexibility in the design of the magnetic multilayer structure 38. Using principles of the present disclosure, therefore, the magnetic multilayer structure 38 can be designed to optimize the desired properties of the magnetic device, for instance, without regard to the offset field. The magnetic layer 46 can then be designed and implemented in the contact hole 44 to compensate for any offset field of the magnetic multilayer structure.

Figure 6A:
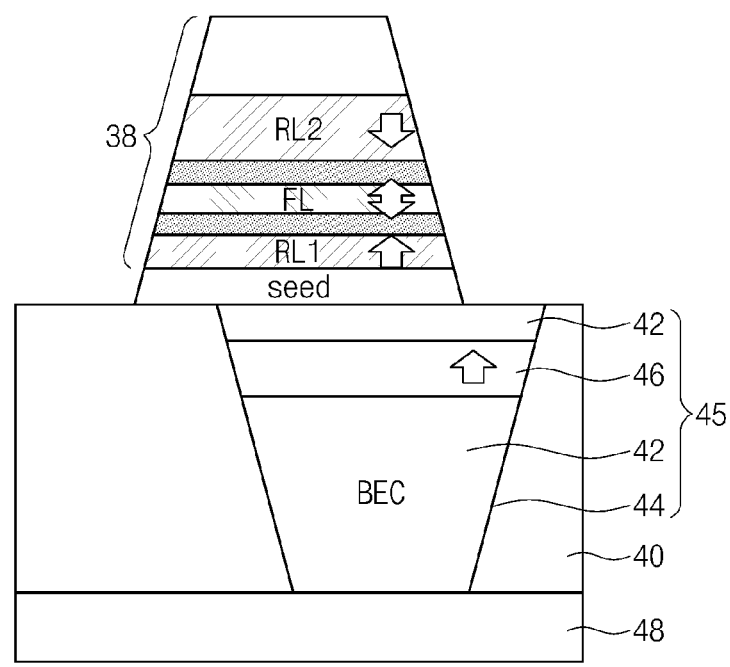
FIGS. 6a and 6b are schematic cross sectional and perspective views of a magnetic element and a magnetic layer in a magnetic element, respectively, showing misalignment between the magnetic multilayer structure and the contact structure, according to various additional principles of the present inventive concepts.
Figure 6B:
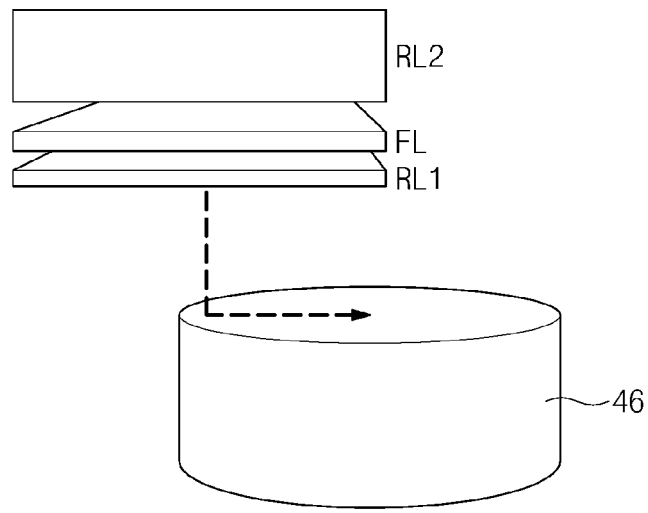
Figure 6C:
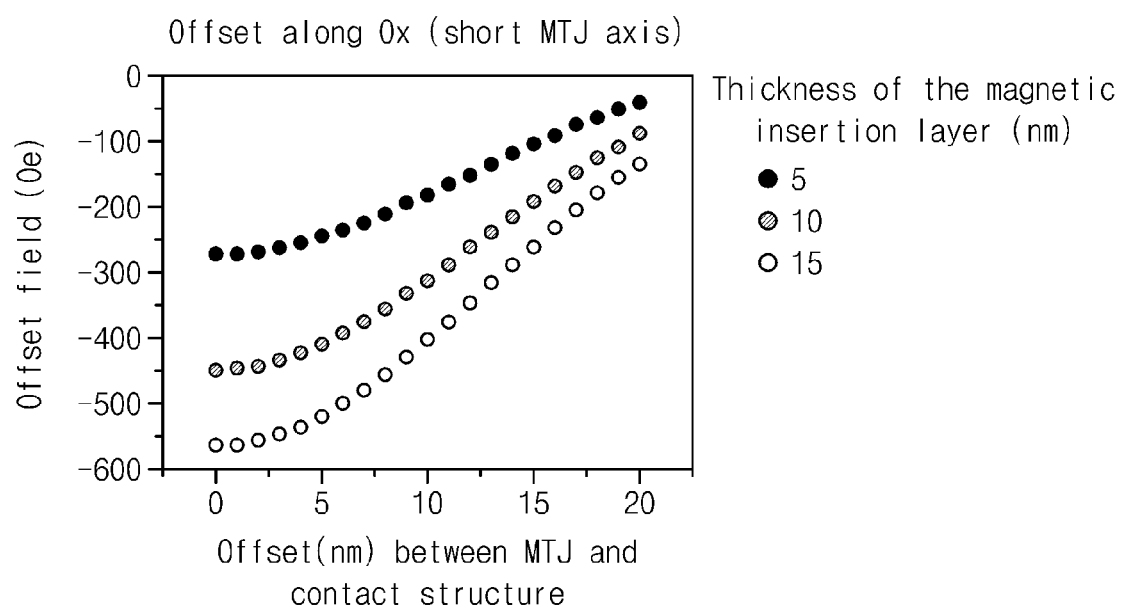
FIG. 6c is a graph illustrating the effects of misalignment between the magnetic multilayer structure and the contact structure as represented in FIGS. 6a and 6b, as determined through micro magnetic simulations based on some specific simulation parameters.

FIGS. 6a and 6b are schematic diagrams illustrating a misalignment between the magnetic multilayer structure 38 and the corresponding contact structure 45. FIG. 6c is a graph illustrating the effects of the present inventive concept on the misalignment margin between the magnetic multilayer structure 38 and the contact structure 45.

Referring to FIGS. 6a through 6c, a misalignment of a quarter-pitch or less (e.g., <5 nm for 20 nm node) results in little or no change in the $H_{offset}$ margin. As the misalignment increases to about a half-pitch (e.g., 10 nm for 20 nm node), there is a 15-30% drop in the stray field acting on the free layer FL. Accordingly, misalignments due, for instance, to manufacturing processes, have little effect on the stray field asserted by the magnetic layer 46 on its corresponding magnetic multilayer structure 38 and the tolerances for alignment of the contact structure 45 and the magnetic multilayer structure 38 are therefore loose. Thus, even when there is a substantial misalignment between the contact structure 45 and the magnetic multilayer structure 38 (e.g., an MTJ structure), with embodiments of the present disclosure, the offset field or $H_{offset}$ can be properly controlled, providing sufficient manufacturing process margins and relaxing the tolerance requirements for the reference layers.

It should also be noted that the offset field from the magnetic layer 46 in the contact hole 44 disappears almost entirely at the position of an adjacent magnetic element, which can separated by e.g. two pitches from the original one. Accordingly, a magnetic layer 46 arranged in the BEC structure coupled to one magnetic multilayer structure will have little or no influence on adjacent magnetic memory elements. Thus, by employing embodiments of the present disclosure, further scaling down of magnetic devices can be possible.

Figure 7A:
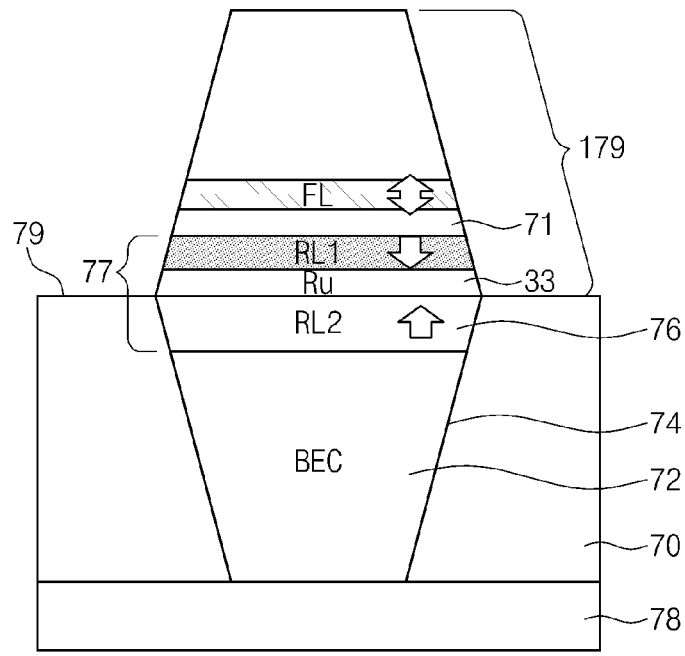
FIGS. 7a through 7c are schematic cross-sectional views of magnetic memory elements constructed according to still further embodiments incorporating principles of the present disclosure.
Figure 7B:
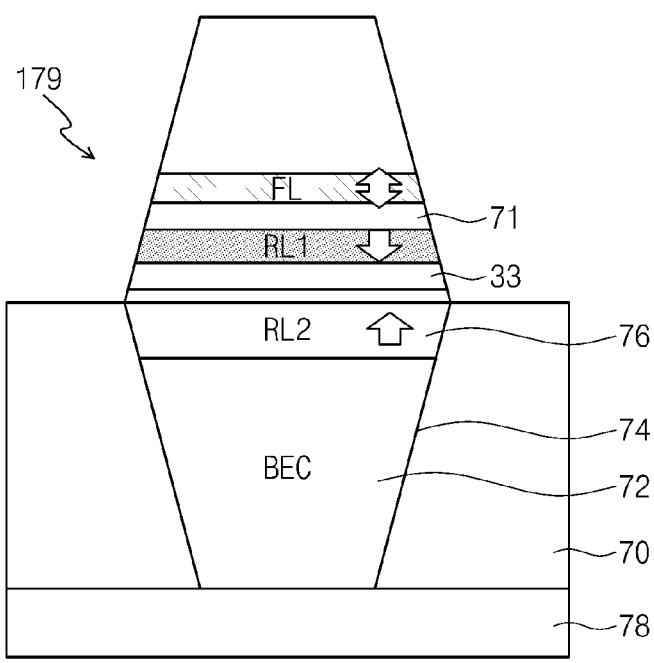

In an alternative embodiment, such as illustrated in FIGS. 7a and 7b, for example, a magnetic material or magnetic layer 76 formed in a contact hole 74 can act as a reference layer for a magnetic multilayer structure 179. The multilayer structure 179 can be for instance used to form a single MTJ (single tunneling barrier 71) structure, as a part of synthetic anti-ferromagnetic (SAF) reference layer 77.

The principles of the invention are relevant, however, to any magnetic devices having, for example, single or multi-level cell structures, one or more free layers, multiple pinned layers, a synthetic anti-ferromagnetic (SAF) free layer, an anti-ferromagnetic (AF) coupling free layer, a SAF pinned layer, a single pinned layer, a giant magnetoresistance memory (GMR) barrier layer (formed of a thin layer of conductive material such as copper (Cu)) and/or a tunneling magnetoresistance memory (TMR) barrier layer (formed of an electrically non-conductive dielectric material such as MgO) TMR barriers and so on.

A non-magnetic exchange-coupling layer formed of a material such as Ru is formed between the reference layers RL1, RL2 to form the SAF layer 77. In this embodiment, the magnetic layer 76 in the contact hole 74 can be arranged fully (see FIG. 7a) or only partially (see FIG. 7b) within the contact hole 74 (i.e., completely or partially below the upper surface level of an interlevel dielectric layer 70), and can function as one of the reference layers for a magnetic device.

In some embodiments, the reference layers RL1, RL2 and the free layer FL are shown with a particular orientation, these layers may be oriented differently. For example, the reference layers RL1, RL2 may be disposed over the free layer FL.

Figure 7C:
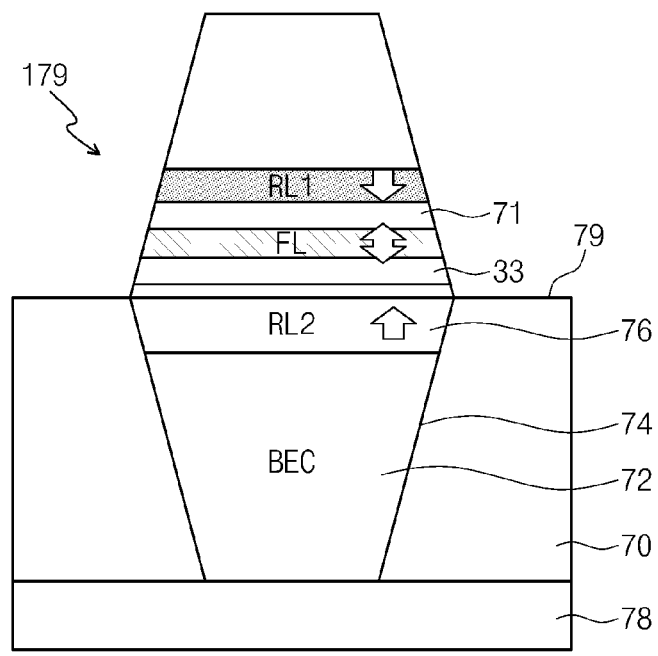

In yet another embodiment, as illustrated for instance in FIG. 7c, a magnetic layer 76 arranged in a contact hole 74 can act as a reference layer for a DMTJ structure 179. Again, in this case, the magnetic layer 76 can be arranged completely or only partially within the contact hole 74 (i.e., completely or partially below an upper or top surface 79 of the interlevel dielectric layer 70). In the embodiment shown in FIG. 7c, the magnetic layer 76 arranged in the contact hole 74 may extend above the upper or top surface 79 of the interlevel dielectric layer 70 and acts as a second reference layer for the DMTJ structure 179. Thus, according to some embodiments of the present disclosure, the magnetic layer 76 may not only compensate for the offset field or stray field resulting from the reference layers, but may additionally or alternatively create a spin polarization on the free layer FL.

Again, additional embodiments incorporating the inventive concepts, such as those based on the specific non-limiting, simulation parameters provided, may provide additional margin of approximately 500 Oe or more for the offset field. For instance, by way of example but not limitation, an embodiment may utilize a high-$M_s$ ferromagnetic material such as high-$M_s$ PMA alloys (i.e., those having an $M_s$ higher than about 800 emu/cc) as the magnetic layer 76 arranged in the contact hole 74. The distance between the magnetic layer 76 in the contact hole 74 and the free layer FL may also be reduced (e.g., below approximately 10 nm) to provide additional margin for the offset field. Additionally, or alternatively, the diameter of the magnetic layer 76 in the contact hole 74 can be increased (i.e., to >25 nm for a 20 nm-node MTJ). In each case, an increase in the stray field applied from the magnetic layer 76 in the contact hole 74 to the free layer FL of the magnetic multilayer structure 78 can be obtained by manipulating the characteristics of the magnetic layer 76.

Figure 8:
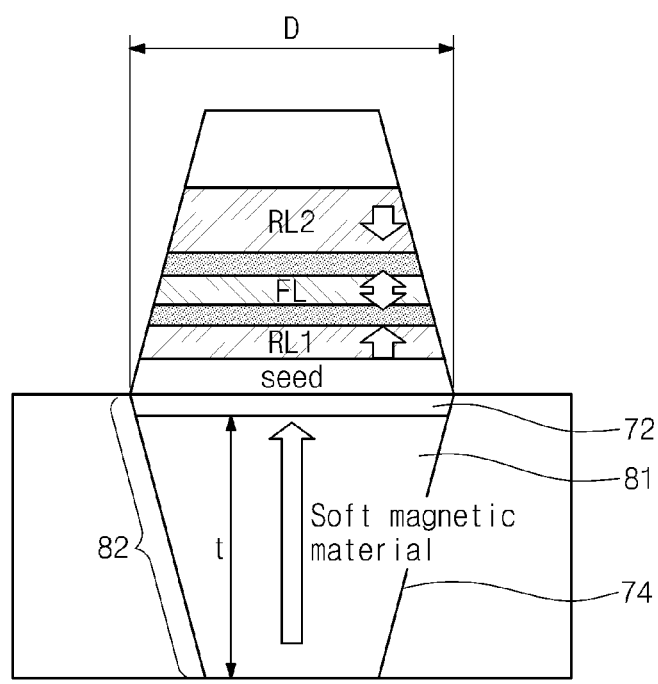
FIG. 8 is a schematic cross-sectional view of a magnetic element constructed according to yet another embodiment incorporating principles of the present disclosure.

In a still further embodiment, illustrated in FIG. 8, a substantial part of the contact hole 74 can be filled with a soft magnetic material (i.e., a material with essentially small magnetic anisotropy, i.e., Fe and the like) or with a PPMA magnetic material, which forms a magnetic insertion layer 81 in the contact hole 74. In this embodiment, the thickness (or depth of filling) "t" of the magnetic insertion layer 81 may be substantially equal to or larger than the diameter D of the magnetic insertion layer 81 such that the shape anisotropy of the magnetic insertion layer 81 would enhance its magnetic stability. As a result, the magnetization of the layer 81 would become perpendicular to its plane. In another embodiment, although not shown, even if the thickness "t" of the magnetic insertion layer 81 is greater than the diameter D of the magnetic insertion layer 81, the magnetic insertion layer 81 may still be positioned over a contact material 42 formed of a material such as W within the contact hole 74.

Figure 9A:
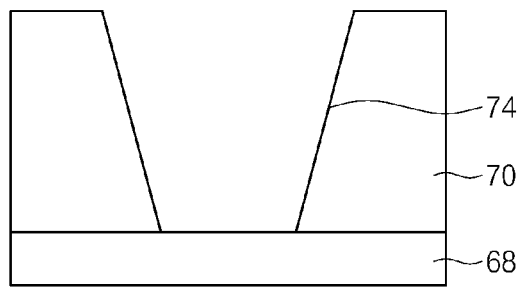
FIG. 9a through 9d are schematic cross-sectional views for illustrating a method of constructing the magnetic element of FIG. 3 according to one embodiment of the present disclosure.
Figure 9B:
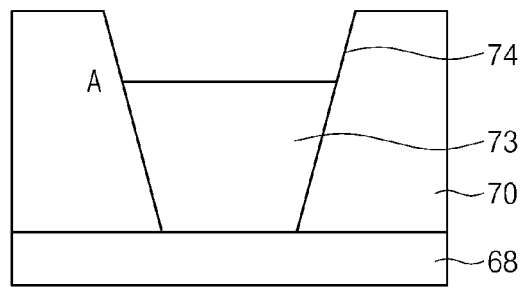
Figure 9C:
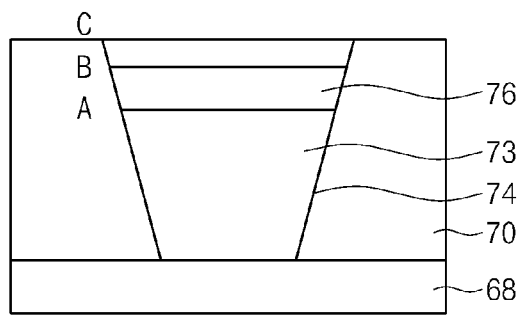
Figure 9D:
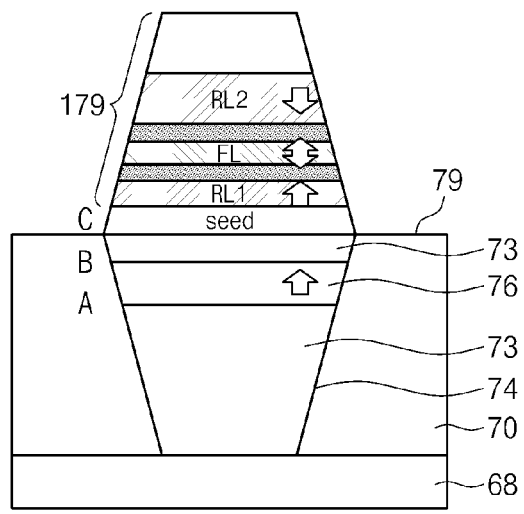

Various methods of manufacture are also contemplated for providing the inventive concepts. According to one embodiment, illustrated in FIG. 9a, a contact hole 74 may be formed in an interlevel dielectric layer 70 overlying a semiconductor substrate 68. As shown in FIG. 9b, the contact hole 74 can then be partially filled up to a desired level A with a contact material 73 such as a non-magnetic, electrically conductive contact material (e.g., tungsten (W)) to form a bottom electrode contact (BEC) or bottom contact (BC). A magnetic material is then deposited on top of the contact material 73 to form a magnetic layer 76 over the contact material 73 up to a desired level B within the contact hole 74. The remainder of the contact hole 74 is then again filled with tungsten (W) or other appropriate contact material up to the upper surface level C of the interlevel dielectric layer 70. A magnetic multilayer structure 179 can then be formed in a conventional manner above the interlevel dielectric layer 70 overlying the filled contact hole 74 as shown in FIG. 9*d*.

Figure 10A:
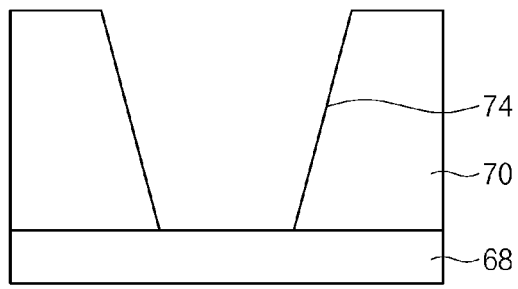
FIGS. 10a through 10d are schematic cross-sectional views of a magnetic element illustrating an alternative embodiment incorporating principles of the present disclosure.
Figure 10B:
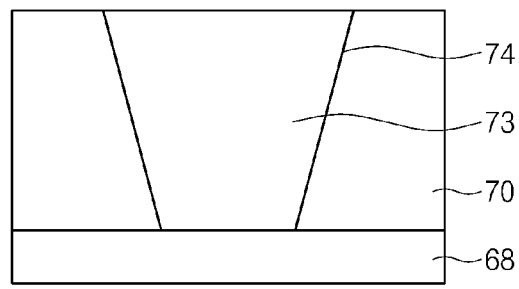
Figure 10C:
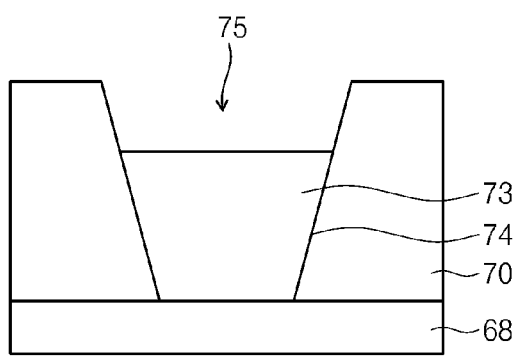
Figure 10D:
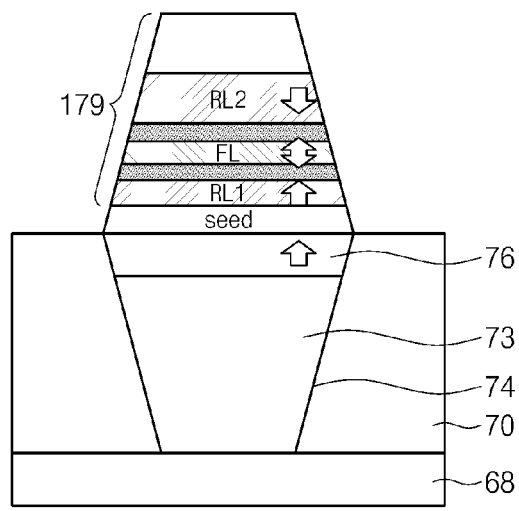

In an alternative embodiment, illustrated in FIG. 10*a*, the contact hole 74 can be filled up to the level of the top surface of the interlevel dielectric layer 70 with a contact material 73 (e.g., tungsten (W) or other conventional material). A divot 75 is then formed in the contact material 73, such as through an RIE etching or other etching process. A magnetic material is then deposited in the divot formed in the contact material 73 to fill the divot 75. Any excess magnetic material above the level of the upper or top surface 79 of the interlevel dielectric layer 70 can be removed through a chemical mechanical planarization (CMP) or other similar planarization process. A magnetic multilayer structure 179 can then be formed above the interlevel dielectric layer 70 above the filled contact hole 74. In another embodiment (not shown), a magnetic material is deposited in the divot 75 formed in the contact material 73 such as it does not completely fill the divot 75, and any another conductive non-magnetic material is deposited on top of this magnetic material to completely fill the divot 75.

In some embodiments, there may be several ways to set the magnetization direction of the magnetic layer in the BEC initially. For example, one of the reference layers may have the same or similar switching field as the magnetic layer arranged in the BEC. This can be accomplished, for instance, by selecting a magnetization of saturation $M_s$ and magnetic anisotropy Ku (which may include the shape anisotropy) for the reference layer RL that is close to those for the material used for the magnetic insertion layer. As a result, the magnetic layer and that reference layer can be set using the same field or an equivalent field. Alternatively, composition of the BEC insertion can be chosen such that it has much larger Ku than other reference layers. In this case, the BEC magnetic layer may be set first using a largest magnetic field, with the reference layers being set subsequently using smaller magnetic fields.

Although the present disclosure has been described in connection with a bottom electrode contact (BEC) or bottom contact (BC), the principles of the inventive concept can also be applied to an upper electrode contact or upper contact electrically and/or magnetostatically coupled to the free layer of the magnetic devices. Thus, according to some embodiments of the present disclosure, the magnetic devices of the present disclosure can include a magnetic layer or magnetic material formed in a bottom electrode contact or upper electrode contact or both. Thus, more precise control of the offset field may be possible with various embodiments of the present disclosure.

Furthermore, with the embodiments of the present disclosure, the high-aspect ratio contact hole can be filled without an undesirable void therein or other problems relating to the filling of the high-aspect ratio contact holes.

The principles of the present disclosure can be applied to either in-plane and perpendicular STT-RAM devices or to combinations of in-plane and perpendicular STT-RAM devices (e.g., devices in which the free layer has a high perpendicular anisotropy while the equilibrium magnetic moment of the free layer remains in-plane). One example of such a device may be seen in U.S. Pat. No. 6,992,359, the contents of which are incorporated herein by reference in their entirety. Another example may be seen in U.S. patent application Ser. No. 13/011,849, the contents of which are incorporated herein by reference in their entirety. Thus, the magnetization of the free layer of the STT-RAM devices may be completely or partially in-plane. For example, one example can be an MTJ cell, in which one or more reference layers exert an uncompensated in-plane stray field on a free layer, and the magnetic material or magnetic layer arranged in the contact hole exerts an oppositely directed in-plane compensating field.

In summary, with embodiments of the present disclosure, additional means of compensating for the offset field are provided, which in turn increase the $H_{offset}$ margin, and consequently improve manufacturing process margins. In particular, the tolerance requirements of the reference layer can be relaxed by employing the novel inventive concepts of the present disclosure. Also, more stable operation of the magnetic devices can be achieved through improved control of the stray field applied to the free layer of the magnetic devices. Furthermore, the thickness of the magnetic multilayer structure can be substantially reduced, especially when the magnetic layer in the BEC acts as a reference layer, thus helping reduce the size of the magnetic devices.

The principles of the present disclosure can be also applied to either in-plane or perpendicular STT-RAM devices or to combinations of in-plane and perpendicular STT-RAM devices which could benefit from having a bias magnetic field applied at a free layer. In other words, the performance of such STT-RAM devices can be improved with the principles of the present disclosure if the total net magnetic field acting on the free layer or one or more other layers is essentially non-zero. One such example may be an MTJ cell where the magnetic material or magnetic layer is arranged in the BEC exerts a bias field on a free layer, and the bias field is essentially non-collinear to the magnetization direction of the free layer, which can be either perpendicular to the plane or in-plane or have both perpendicular-to-the-plane and in-plane components. Another example is an MTJ cell where the magnetic material or magnetic layer is arranged in the BEC exerts a bias field on a reference layer, and the bias field is essentially non-collinear to the magnetization direction of the one or more of the reference layers, which can be either perpendicular to the plane or in-plane or have both perpendicular-to-the-plane and in-plane components.

The principles of the present disclosure may be applied to a variety of other magnetic element or magnetic multilayer structures. A single MTJ or dual MTJ discussed above are, therefore, only some examples of such structures. For example, the principles of the present disclosure may also be applied to any magnetic element having a spin valve, e.g., spin valve STT-MRAM having conductive spacer layers formed of a conductive material such as CR, Ta, Ti, W, and Ru, one example of which is shown in U.S. Pat. No. 7,821,088, the contents of which are incorporated herein by reference in their entirety. In addition, the present disclosure can be applied to a ballistic magnetoresistance structure. Also, the principles of the present disclosure may be applied to spin logic devices. The spin logic devices may be, for example, all-spin logic (ASL) device and non-volatile spin logic device, the example of which may be seen in U.S. Provisional Application No. 61/512,163, the entire contents of which are incorporated herein by reference.

Figure 11:
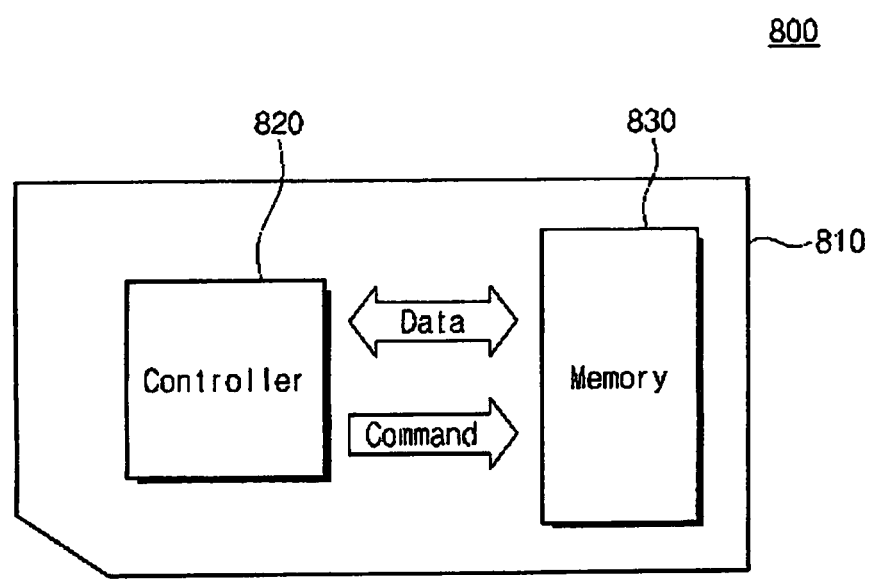
FIG. 11 is a schematic view of a memory card in which a magnetic device according to some embodiments of the inventive concept is used.

FIG. 11 is a schematic view of a memory card 800 in which a magnetic device according to some embodiments is used.

Referring to FIG. 11, the memory card 800 may include a memory controller 820 and a magnetic device 830 in a housing 810. The controller 820 and the magnetic device 830 may exchange electrical signals. For example, the magnetic device 830 and the controller 820 may exchange data in response to the command of the controller 820. Accordingly, the memory card 800 may store data in the magnetic device 830 or may output the data stored in the magnetic device 830 to the outside. The controller 820 can also be an internal part of the magnetic device depending on applications.

The memory card 800 may be used as data storage media for a variety of portable devices. For example, the memory card 800 may be a multimedia card (MMC), or a secure digital card (SD).

Figure 12:
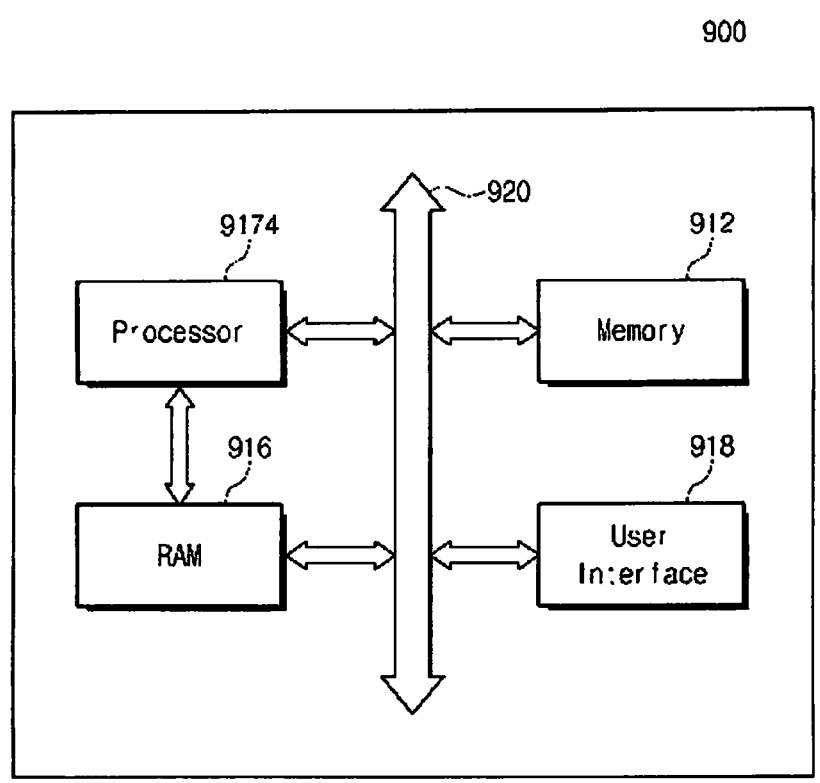
FIG. 12 is a schematic view of an electronic system in which a magnetic device according to an embodiment of the inventive concept is used.

FIG. 12 is a schematic view of an electronic system 900 in which the magnetic device according to an embodiment of the inventive concept is used. The electronic system 900 may be used for a mobile telecommunication device or a computer such as a portable notebook computer, Ultra-Mobile PCs (UMPC), and Tablet PCs. For example, the electronic system 900 may include a memory system 912, a processor 914, RAM 916, and a user interface 918, which may execute data communication using a bus 920. The processor 914 may be a microprocessor or a mobile processor (AP). The processor 914 may have a processor core (not illustrated) that can include a floating point unit (FPU), an arithmetic logic unit (ALU), and a digital signal processing core (DSP Core), or any combinations thereof. The processor 914 may execute the program and control the electronic system 900. The RAM 916 may be used as an operation memory of the processor 914. For example, the processor 914 or the RAM 916 may include a magnetic device according to example embodiments. Alternatively, the processor 914 and the RAM 916 may be packaged in a single package body. The user interface 918 may be used in inputting/outputting data to/from the electronic system 900. The memory system 912 may store codes for operating the processor 914, data processed by the processor 914, or externally input data. The memory system 912 may include a controller and a memory, and has substantially the same configuration as that of the memory card 800 shown in FIG. 11.

The electronic system 900 may be used in electronic controllers for a variety of electronic devices.

Figure 13:
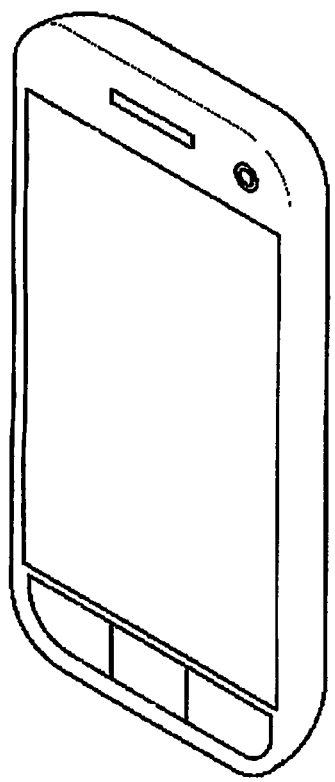
FIG. 13 is a schematic view of a mobile phone in which the electronic system according to an embodiment of the inventive concept is used.

FIG. 13 is a schematic view of a mobile phone 1000 in which the electronic system (900 of FIG. 12) according to an embodiment of the inventive concept is used. Additionally, the electronic system (900 of FIG. 28) may be used for an mpeg-1 audio layer 3 (MP3) player, a navigator, a solid state disk (SSD), automobiles, a server, or household appliances.

Throughout the specification, features shown in one embodiment may be incorporated in other embodiments within the spirit and scope of the inventive concept.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used herein, the term magnetic could include ferromagnetic, ferrimagnetic or the like. Thus, the term "magnetic" or "ferromagnetic" includes, for example, ferromagnets and ferrimagnets. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Various operations may be described as multiple discrete steps performed in a manner that is most helpful in understanding the invention. However, the order in which the steps are described does not imply that the operations are order-dependent or that the order that steps are performed must be the order in which the steps are presented.

With respect to the use of substantially any plural and/or singular terms herein, those having skill in the art can translate from the plural to the singular or from the singular to the plural as is appropriate to the context and/or application. The various singular/plural permutations may be expressly set forth herein for sake of clarity.

It will be understood by those skilled in the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. Furthermore, in those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It should be noted that the inventive concepts are not limited by any of the specific embodiments described in the foregoing summary, and that numerous other aspects and embodiments utilizing the present inventive concepts will be readily understood by those of ordinary skill in the art from the disclosures provided herein. The foregoing illustrative embodiments are, therefore, not to be construed as limiting the invention thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

What is claimed is:

1. A magnetic device, comprising:
a magnetic multilayer structure having one or more free layers and one or more reference layers, said one or more free layers and said one or more reference layers each having a magnetization direction that is substantially perpendicular to its plane;
a contact structure electrically coupled to the magnetic multilayer structure, the contact structure having a magnetic material therein configured to exert a magnetic field on the one or more free layers of the magnetic multilayer structure, said magnetic material having a substantially perpendicular magnetic anisotropy (PMA).

2. The magnetic device according to claim 1, wherein said one or more free layers and one or more reference layers are all stacked vertically one on top of another.

3. The magnetic device according to claim 1, wherein the contact structure has a width that is larger at a contact interface with the magnetic multilayer structure and narrower at a contact interface with a substrate.

4. The magnetic device according to claim 1, wherein the magnetic material comprises a ferromagnetic material including a perpendicular magnetic anisotropy (PMA) material chosen from (1) rare-earth transition metal (RE-TM) alloys; (2) multi-layers of Co/Pd, Co/Pt, Fe/Pd, Fe/Pt, or Co/Ru; (3) alloys of CoFeB, CoPd, CoPt, FePt, FePd; (4) or combinations thereof.

5. The magnetic device according to claim 1, wherein the magnetic material includes a partial perpendicular magnetic anisotropy (PPMA) material, in which a perpendicular anisotropy energy does not exceed an out-of-plane demagnetization energy.

6. The magnetic device according to claim 5, wherein the PPMA material includes one or more of Co, Fe, Ni and their alloy with other nonmagnetic element.

7. The magnetic device according to claim 5, wherein the PPMA material includes a multilayer of Co/Pd, Co/Pt, Fe/Pd, Fe/Pt, Co/Ru or combinations thereof.

8. The magnetic device according to claim 1, wherein the magnetic material includes a combination of PPMA and PMA materials.

9. The magnetic device according to claim 1, wherein the magnetic material is represented by a formula XY, where X is at least one of Ni, Co, or Fe; and where Y is either Pt or Pd, or a combination thereof.

10. The magnetic device according to claim 1, wherein the magnetic material comprises a material represented by a formula XYZ, where X is at least one of Ni, Co, or Fe; where Y is either Pt or Pd, or a combination thereof; and where Z includes at least one of Ti, Zr, Hf, V, Nb, Ta, Cr, Mo, W, Ir, Rh, Ru, Os, Re, Au, Ag, Cu, B, C, N, O, Al, Si, P, S, Ga, Ge, In, Sn, Gd, Tb, Dy, Ho, Nd, or a transition metal silicide.

11. A magnetic device, comprising:
a bottom electrode contact hole formed in an interlevel dielectric layer over a semiconductor substrate;
a stacked magnetic multilayer structure arranged above the bottom electrode contact hole, the stacked magnetic multilayer structure comprising one or more free layers and one or more reference layers, all of which are stacked vertically one on top of the other; and
a magnetic layer arranged at least partially within the bottom electrode contact hole.

12. The magnetic device according to claim 11, wherein the one or more reference layers exerting a combined offset field on the one or more free layers of the magnetic multilayer structure, and wherein magnetic properties of the magnetic layer in the bottom electrode contact hole compensate for the combined offset field by the one or more reference layers.

13. The magnetic device according to claim 12, wherein the saturation magnetization and the magnetic anisotropy of the magnetic layer are approximately the same as those of one or more of the reference layers in the magnetic multilayer structure.

14. The magnetic device according to claim 12, wherein the magnetic anisotropy (Ku) of the magnetic layer is higher than that of the one or more reference layers in the magnetic multilayer structure.

15. The magnetic device according to claim 11, wherein the magnetic layer is arranged between layers of a non-magnetic conductive material in the bottom electrode contact hole.

16. The magnetic device according to claim 11, wherein the magnetic layer is arranged below substantially all of a non-magnetic conductive material in the bottom electrode contact hole.

17. The magnetic device according to claim 11, wherein the magnetic layer is arranged entirely below an upper surface of the interlevel dielectric layer.

18. The magnetic device of claim 11, wherein substantially all of the contact hole is filled with a magnetic material.

19. The magnetic device of claim 18, wherein the magnetic material is chosen from a soft magnetic material or a material with partial-perpendicular magnetic anisotropy.

20. The magnetic device of claim 11, wherein the bottom electrode contact hole has a width that is greater nearer the stacked magnetic multilayer structure and narrower away from the stacked magnetic multilayer structure.

21. The magnetic device of claim 11, wherein the magnetic layer comprises materials having $Co_xFe_{1-x}B_y$ as one of their components, where x and y can be between 0 to 1 (including 0 and 1), and other components being MgO or Ta.

22. A magnetic device, comprising:
a bottom electrode contact hole formed in an interlevel dielectric layer over a semiconductor substrate;
a magnetic multilayer structure arranged above the bottom electrode contact hole, the magnetic multilayer structure comprising one or more free layers and one or more reference layers; and
a magnetic layer arranged at least partially within the bottom electrode contact hole, wherein the magnetic layer is arranged above substantially all of a non-magnetic conductive material arranged in the bottom electrode contact hole.

23. A magnetic device, comprising:
a bottom electrode contact hole formed in an interlevel dielectric layer over a semiconductor substrate;
a magnetic multilayer structure arranged above the bottom electrode contact hole, the magnetic multilayer structure comprising one or more free layers and one or more reference layers; and
a magnetic layer arranged at least partially within the bottom electrode contact hole, wherein the magnetic layer extends at least partially above an upper surface of the interlevel dielectric layer.

24. A magnetic device, comprising:
a plurality of magnetic elements arranged over an interlevel dielectric layer, said interlevel dielectric layer directly overlying a semiconductor substrate;
wherein one or more of the magnetic elements comprises:
a bottom electrode contact hole extending through the interlevel dielectric layer to the substrate;
a magnetic multilayer structure comprising a free layer and one or more reference layers, said one or more free layers and said one or more reference layers all stacked one on top of the other, and each having a magnetization direction that is substantially perpendicular to its plane; and
a magnetic layer formed at least partially within the bottom electrode contact hole.

25. The device according to claim 24, wherein the magnetic layer formed at least partially within the bottom electrode contact hole acts as a reference layer for the magnetic multilayer structure.

26. The device according to claim 24, wherein the magnetic layer of one magnetic element exerts little or no magnetic influence on a magnetic multilayer structure of an adjacent magnetic element.

* * * * *